United States Patent
Kao et al.

(10) Patent No.: US 6,876,031 B1
(45) Date of Patent: Apr. 5, 2005

(54) METHOD AND APPARATUS FOR SPLIT GATE SOURCE SIDE INJECTION FLASH MEMORY CELL AND ARRAY WITH DEDICATED ERASE GATES

(75) Inventors: Dah-Bin Kao, 3624 Lupine Ave., Palo Alto, CA (US) 94303; Loc B. Hoang, 5253 Rooster Dr., San Jose, CA (US) 95136; Albert T. Wu, 3801 Nathan Way, Palo Alto, CA (US) 94303; Tung-Yi Chan, 1427 Graywood Dr., San Jose, CA (US) 95129

(73) Assignees: Winbond Electronics Corporation, Hsin chu (TW); Dah-Bin Kao, Palo Alto, CA (US); Loc B. Hoang, San Jose, CA (US); Albert T. Wu, Palo Alto, CA (US); Tung-Yi Chan, San Jose, CA (US)

( * ) Notice: Subject to any disclaimer, the term of this patent is extended or adjusted under 35 U.S.C. 154(b) by 0 days.

(21) Appl. No.: 09/256,265

(22) Filed: Feb. 23, 1999

(51) Int. Cl.⁷ .................... H01L 29/788; G11C 16/04
(52) U.S. Cl. ............. 257/315; 257/317; 365/185.01; 365/185.26; 365/185.29
(58) Field of Search ............... 257/315–323; 365/185.01, 185.05, 185.26, 185.29

(56) References Cited

U.S. PATENT DOCUMENTS

| | | | | |
|---|---|---|---|---|
| 4,099,196 A | * | 7/1978 | Simko | 257/317 |
| 4,998,220 A | * | 3/1991 | Eitan et al. | 257/321 |
| 5,109,361 A | * | 4/1992 | Yim et al. | 365/185.12 |
| 5,216,269 A | * | 6/1993 | Middelhoek et al. | 257/318 |
| 5,229,632 A | * | 7/1993 | Yoshikawa | 257/320 |
| 5,252,847 A | * | 10/1993 | Arima et al. | 257/320 |
| 5,455,793 A | * | 10/1995 | Amin et al. | 365/185.26 |
| 5,579,259 A | * | 11/1996 | Samachisa et al. | 365/185.14 |
| 5,583,810 A | * | 12/1996 | Van Houdt et al. | 365/185.15 |
| 5,708,285 A | * | 1/1998 | Otani et al. | 257/315 |
| RE35,838 E | * | 7/1998 | Momodomi et al. | 365/185.17 |
| 5,821,143 A | * | 10/1998 | Kim et al. | 438/267 |
| 5,874,759 A | * | 2/1999 | Park | 257/314 |
| 6,125,060 A | * | 9/2000 | Chang | 365/185.29 |
| 6,246,612 B1 | * | 6/2001 | Van Houdt et al. | 365/185.29 |
| 6,274,436 B1 | * | 8/2001 | Kao et al. | 438/267 |
| 6,355,527 B1 | * | 3/2002 | Lin et al. | 438/265 |

FOREIGN PATENT DOCUMENTS

JP          041241468 A   *   8/1992         H01L/29/788

* cited by examiner

Primary Examiner—Jerome Jackson
Assistant Examiner—José R. Diaz

(57) ABSTRACT

A transistor structure having a dedicated erase gate where the transistor can be used as a memory cell is disclosed. The presently preferred embodiment of the transistor comprises a floating gate disposed on a substrate and having a control gate and an erase gate overlapping said floating gate, with drain and source regions doped on the substrate. By providing a dedicated erase gate, the gate oxide underneath the control gate can be made thinner and can have a thickness that is conducive to the scaling of the transistor. The overall cell size of the transistor remains the same and the program and read operation can remain the same. Both the common source and buried bitline architecture can be used, namely twin well or triple well architectures. A memory circuit using the transistors of the present invention is disclosed as well for flash memory circuit applications.

5 Claims, 6 Drawing Sheets

METHOD AND APPARATUS FOR SPLIT GATE SOURCE SIDE INJECTION FLASH MEMORY CELL AND ARRAY WITH DEDICATED ERASE GATES

FIELD OF THE INVENTION

The present invention generally relates to memory cells and arrays, and, in particular, to flash memory cells and arrays.

BACKGROUND OF THE INVENTION

Several non-volatile memory technologies have been disclosed in prior art. For example, in U.S. Pat. No. 4,203,158, a non-volatile electrically alterable semiconductor memory devices is disclosed. In that device, electrical alterability is achieved by Fowler-Nordheim tunneling of charges between a floating gate and the silicon substrate through a very thin dielectric. Typically, the thin dielectric is an oxide layer with a thickness of less than 100 angstroms. However, such a device requires a floating gate transistor and a separate select transistor for each storage site. Thus, necessarily, each storage site or cell is large due to the number of transistors required for each cell. Further, another disadvantage is the reliability and manufacturability problem associated with the thin oxide tunnel element between the substrate and the floating gate.

U.S. Pat. Nos. 4,274,012 and 4,599,706 seek to overcome the program of reliability and manufacturability of the thin oxide tunnel element by storing charges on a floating gate through the mechanism of Fowler-Nordheim tunneling of charges between the floating gate and other polysilicon gates. The tunneling of charges would be through a relatively thick inter-polyoxide. Tunneling through thick oxide (thicker than the oxide layer disclosed in U.S. Pat. No. 4,203,158) is made possible by the locally enhanced field from the asperities on the surface of the polycrystalline silicon floating gate. Since the tunnel oxide is much thicker than that of the tunnel oxide between the floating gate and the substrate, the oxide layer is allegedly more reliable and manufacturable. However, this type of device normally require three layers of polysilicon gates which makes manufacturing difficult. In addition, voltage during programming is quite high and demands stringent control on the oxide integrity.

In the non-volatile semiconductor memory disclosed in U.S. Pat. No. 4,616,340, a select gate and a floating gate are formed on the surface portion of the substrate between a source region and the drain region also acting as a control gate through a gate oxide film. A part of a channel current is injected into the floating gate at the surface portion under the edge of the floating gate covered by the select gate.

U.S. Pat. No. 4,698,787 discloses a device that is programmable as if it were an EPROM and erasable like and EEPROM. Although such a device requires the use of only a single transistor for each cell, it is believed that it suffers from the requirement of high programming current which makes it difficult to utilize on-chip high voltage generation for programming and erasing. Further, it is believed that such a device requires tight distribution program/erase thresholds during device generation, which results in low manufacturability yield.

In U.S. Pat. No. 5,023,694, floating gates with sharp edges are illustrated where the edges facilitate the tunneling of electrons between the floating gate and the control gate.

In U.S. Pat. No. 5,029,130, a split gate single transistor electrically programmable and erasable memory cell is disclosed. The single transistor has a source, a drain with a channel region therebetween, defined on a substrate. A first insulating layer is over the source, channel and drain regions. A floating gate is positioned on top of the first insulation layer over a portion of the channel region and over a portion of the drain region. A second insulating layer has a top wall which is over the floating gate, and a side wall which is adjacent thereto. A control gate has a first portion which is over the first insulating layer and immediately adjacent to the side wall of the second insulating layer. The control gate has a second portion which is over the top wall of the second insulating layer and is over the floating gate. Erasure of the cell is accomplished by the mechanism of Fowler-Nordheim tunneling from the floating gate through the second insulating layer to the control gate. Programming is accomplished by electrons from the source migrating through the channel region underneath the control gate and then by abrupt potential drop injecting through the first insulating layer into the floating gate.

U.S. Pat. No. 5,045,488 discloses a method for making an electrically programmable and erasable memory device having a re-crystallized floating gate. In that method, a substrate is first defined. A first layer of dielectric material is grown over the substrate. A layer of polycrystalline silicon or amorphous silicon is deposited over the first layer. The layer of silicon is covered with a protective material and is annealed to form re-crystallized silicon. A portion of the protective material is removed to define a floating gate region. Masking oxide is grown on the floating gate region. The remainder of the protective material with the re-crystallized silicon thereunder is removed. A second layer of dielectric material is formed over the floating gate and over the substrate, immediately adjacent to the floating gate. A control gate is patterned and is formed. The drain and source regions are then defined in the substrate.

The scaling limit to the memory cell size of some of the above described split gate technologies can be partially attributed to the dual functional role of the control gate where the control gate serves both as the control gate as well as the erase gate. When the control gate operates as the erase gate, the voltage applied to the control gate can be as high as 14 volts. Under such scenario, in order for the memory cell to behave properly, the gate oxide must be greater than about 200 Å. This gate oxide thickness requirement (under the control gate) limits the scaling of memory cells.

Therefore, it would be desirable to have a novel memory cell having a structure that does not have such a limit on the scaling of the memory cell. It would be also desirable to have a method for fabricating such a memory cell and array.

SUMMARY OF THE INVENTION

It is therefore an object of the present invention to provide a novel transistor structure that can be scaled without being limited by the structure of the transistor.

It is another object of the present invention to provide a method for manufacturing such a transistor structure.

It is yet another object of the present invention to provide a memory array using the transistors of the present invention.

It is still another object of the present invention to provide a transistor structure having a dedicated erase gate without increasing the cell size of the transistor.

Briefly, the present invention provides for a transistor structure having a dedicated erase gate where the transistor can be used as a memory cell. The presently preferred embodiment of the transistor comprises a floating gate disposed on a substrate and having a control gate and an erase gate overlapping said floating gate, with drain and source regions doped on the substrate. By providing a dedicated erase gate, the gate oxide underneath the control gate can be made thinner and can have a thickness that is conducive to the scaling of the transistor. The overall cell size of the transistor remains the same and the program and read operation can remain the same. Both the common source and buried bitline architecture can be used. A memory circuit using the transistors of the present invention is disclosed as well for flash memory circuit applications.

An advantage of the present invention is that it provides a novel transistor structure that can be scaled without being limited by the structure of the transistor.

Another advantage of the present invention is that it provides a method for manufacturing such a transistor structure.

Yet another advantage of the present invention is that it provides a memory array using the transistors of the present invention.

Still another advantage of the present invention is that it provides a transistor structure having a dedicated erase gate without increasing the cell size of the transistor.

These and other features and advantages of the present invention will become well understood upon examining the figures and reading the following detailed description of the invention.

DRAWINGS

DETAILED DESCRIPTION OF THE PREFERRED EMBODIMENTS

Figure 1:
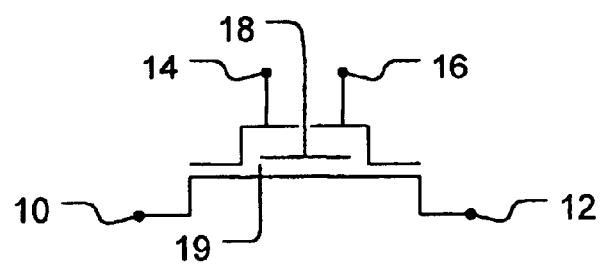
FIG. 1 illustrates a schematic of the transistor of the present invention.

In a presently preferred embodiment of the present invention, a novel structure for a transistor that can be used as a memory cell and the fabrication methods thereof are disclosed. FIG. 1 illustrates the circuit symbol for a presently preferred transistor structure of the present invention having a drain terminal 10, a source terminal 12, a control gate 14, an erase gate 16, and a floating gate 18. In operating such a transistor, referring to Table 1, the general voltage levels for the respective operations are disclosed.

TABLE 1

| | Terminal | | | |
|---|---|---|---|---|
| Operation | Drain | Source | Control | Erase |
| Program | 0 V | 12 V | 2 V | 0 V |
| Read | 2 V | 0 V | 4 V | 0 V |
| Erase | 0 V | 0 V | 0 | 14 V |

In the program operation, the drain terminal and erase gate are connected to ground, a 12 volt potential is applied to the source terminal and a 2 volt potential is applied to the control gate. The floating gate is coupled to the high voltage provided at the source region, and hot carriers under the floating gate and the control gate are produced in the channel region and injected into the floating gate at the corner of the floating gate as indicated at 19. In the read operation, the source terminal and the erase gate are connected to ground, a 2 volt potential is applied to the drain terminal, and a 4 volt potential is applied to the control gate. In the erase operation, the drain and source terminal and the control gate are connected to ground and a 14 volt potential is applied to the erase gate. Here, electrons are removed from the floating gate to the erase gate through the Fowler-Nordheim tunneling process.

Figure 2:
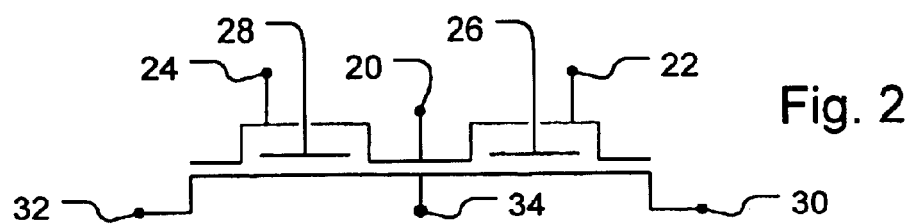
FIG. 2 illustrates the schematic for a pair of the transistors of the present invention.

FIG. 2 illustrates a schematic diagram of a pair of transistors of the present invention. In this configuration, there is an erase gate 20 disposed between the two transistors. A control gate, 22 and 24 respectively, for each of the transistors; a floating gate, 26 and 28 respectively, for each transistor; a drain terminal, 30 and 32 respectively, for each transistor; and a common source terminal 34.

Figure 4:
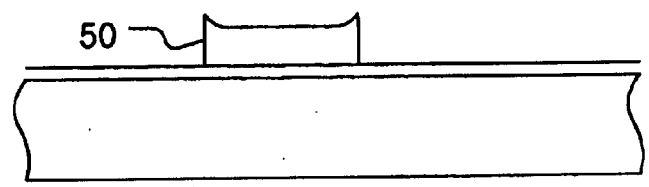
FIG. 4 illustrates an alternative embodiment of the floating gate.
Figure 3A:
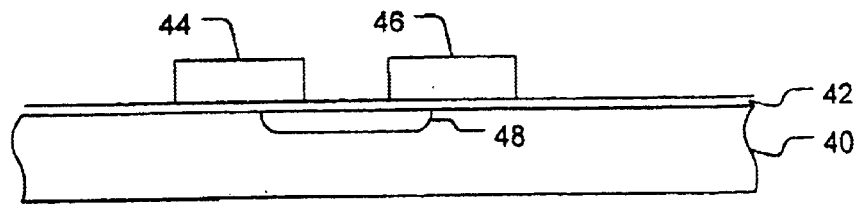
FIGS. 3a–3d illustrate cross-sectional views of the transistor structure during various steps of the fabrication process.

In fabricating the pair of transistors illustrated in FIG. 2, referring to FIGS. 3a–3d, a series of processing steps are carried out. FIG. 3a illustrates a cross-sectional view of a substrate 40 having a first insulation layer 42 disposed thereon and having two floating gates, 44 and 46, patterned over said first insulation layer 42. A source region 48 doped between said two floating gates 44 and 46. The processing steps for forming the structure illustrated in FIG. 3a is commonly known and variations on the various aspects of the floating gate can be incorporated as well. For example, referring to FIG. 4, a floating gate having pointed edges 50 can be patterned and used in the present invention.

Figure 3B:
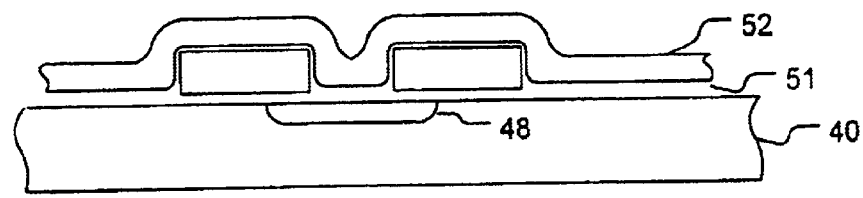
Figure 3C:
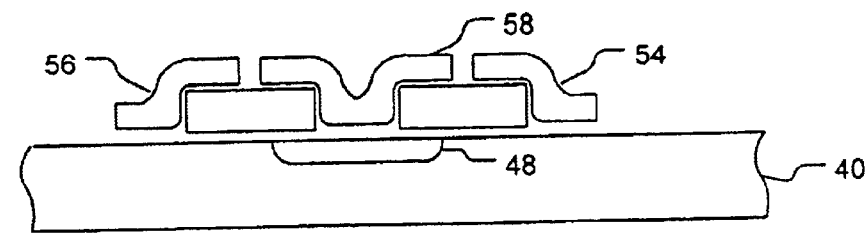
Figure 3D:
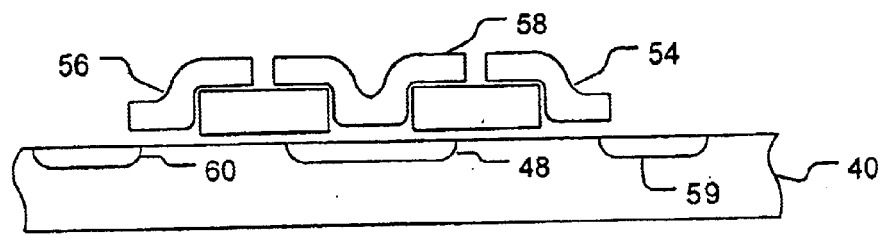

In the next steps, referring to FIG. 3b, a second insulation layer 51 is grown or deposited over the structure of FIG. 3a in order to insulate the floating gates from a second layer of poly-silicon 52 deposited over the entire area. Next, referring to FIG. 3c, the second poly-silicon layer 52 is patterned and etched to define the two control gates, 54 and 56, and the erase gate 58. In the next step, referring to FIG. 3d, the respective drain regions 59 and 60, are formed. The processing steps described above show the fabrication of the transistor pair illustrated in FIG. 2.

Figure 5A:
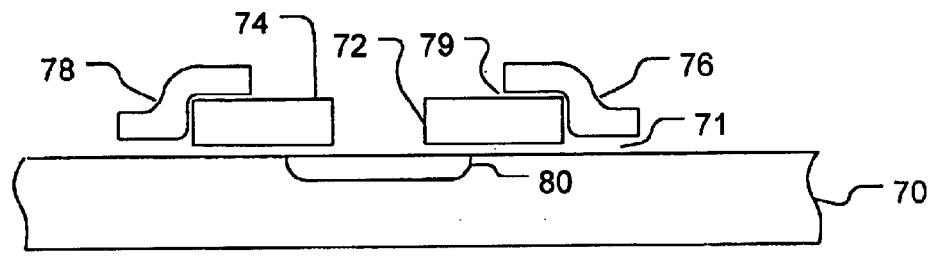
FIGS. 5a–5d illustrate cross-sectional views of the transistor structure during various steps of an alternate fabrication process.
Figure 5B:
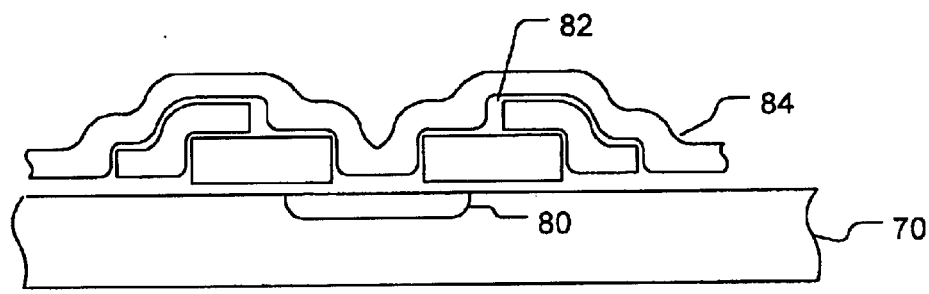
Figure 5C:
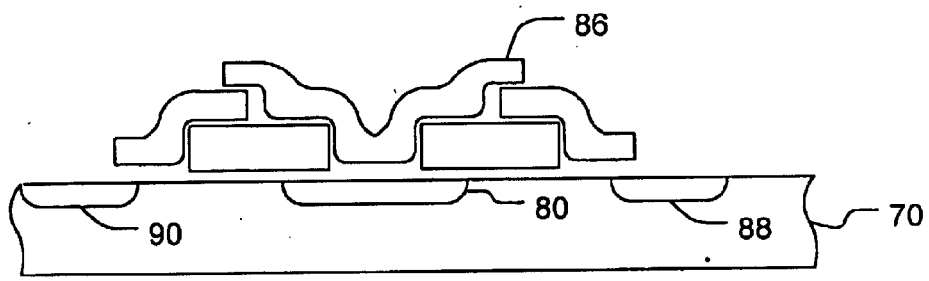
Figure 5D:
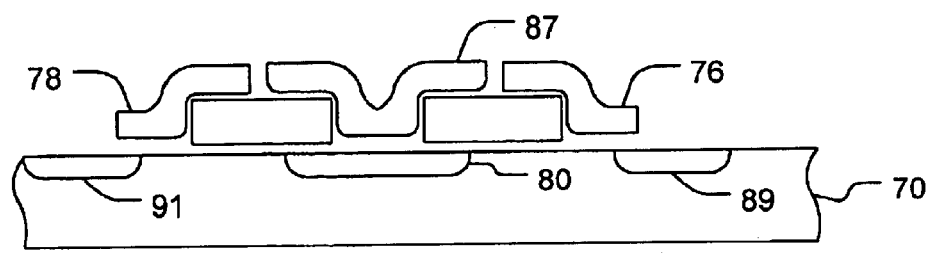

FIGS. 5a–5d illustrate yet another processing method for fabricating the transistor pair shown in FIG. 2. In this alternate method in fabricating the transistor of the present invention, initial processing steps for fabricating the structure illustrated in FIG. 5a are performed. In this structure, there is a substrate 70 having floating gates, 72 and 74 respectively, disposed thereon and separated therefrom by a first insulation layer 71. Over said floating gates 72 and 74, there are control gates 76 and 78 disposed on top of and overlapping said floating gates 72 and 74 and separated therefrom by a second insulation layer 79. A region 80 between said floating gates 72 and 74 is doped as a source region. From this structure, referring to FIG. 5b, a third insulation layer 82 is provided and blanketed over the entire structure to separate a third poly-silicon layer 84 from the rest of the structure. Referring to FIG. 5c, this third polysilicon layer is then patterned to be the erase gate 86 in the shape shown in the figure. After the erase gate 86 is etched, two regions of the substrate is doped to form the drain regions 88 and 90. In this manner, the desired transistor structure is formed.

An alternate structure (FIG. 5d) can be etched from the structure shown in FIG. 5b. In this case, referring to FIG. 5d, the erase gate 87 is etched in a manner that is about flush with the control gate 76 and 78. After this etching step, drain regions 89 and 91 are formed.

Figure 6:
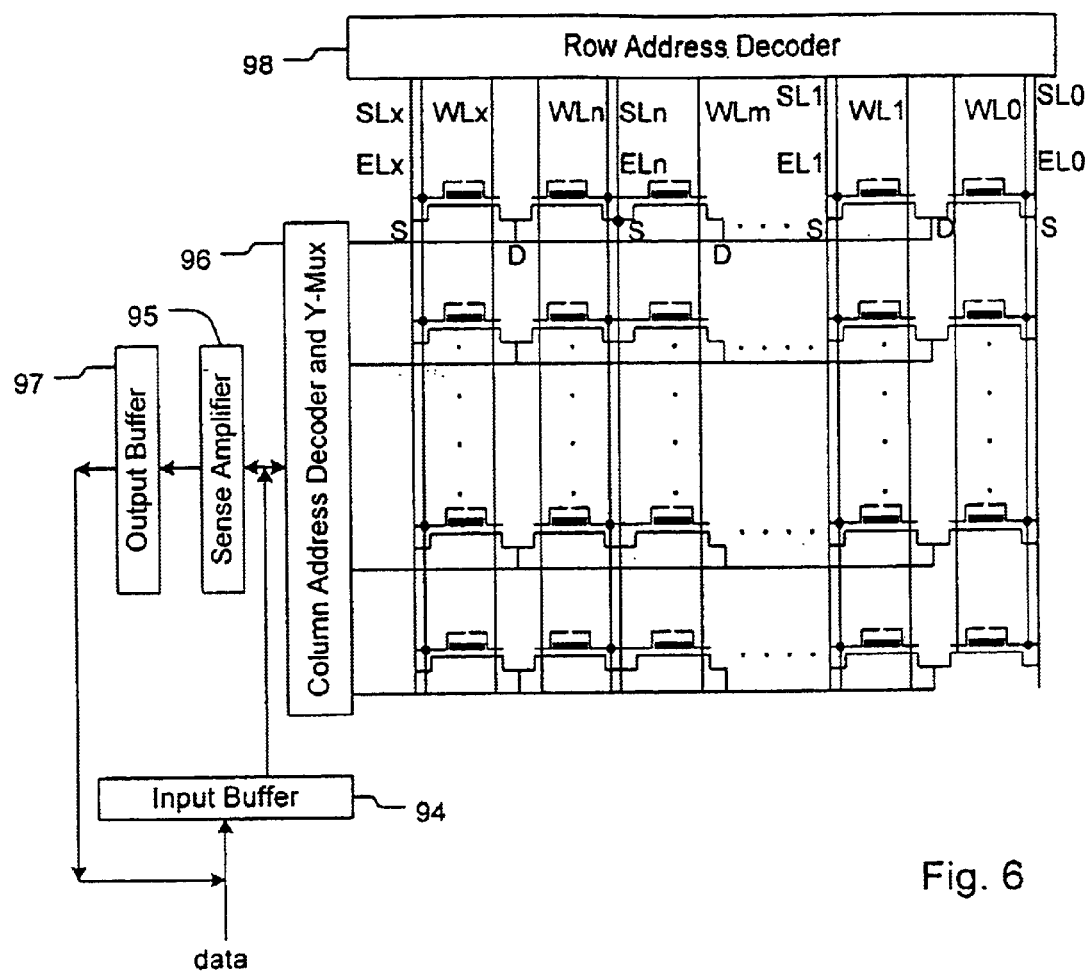
FIG. 6 illustrates a circuit schematic for a memory circuit using the transistors of the present invention.

Transistors of the present invention can be laid out in a memory array using the above described process. FIG. 6 illustrates such a memory array using the transistor-pairs of the present invention. In this memory array circuit, data is received at the input buffer 94 and transmitted to the column address decoder 96 and row address decoder 98. Based on the data received, it would be a read or write operation to the designated cells. The row decoder controls the control gates through the word-lines (WLx), and controls the erase gates through the erase-lines (ELx), and the source regions through the source lines in response to the data received. The column decoder likewise controls the drain lines. With respect to the erase gates, a common erase line can be provided to erase the entire memory block to simplify the row address decoder. Note that the control circuit (row and column decoders) can be varied as desired in controlling the various lines to the memory cells. In reading the data from the memory circuit, the column decoder 96 senses the data stored in the active memory cells and these signals are sampled by the sense amplifier 95 and placed in the output buffer 97 for output.

In operating such a memory array, Table 2 lists the operating voltages for each respective line for performing the desired operations.

TABLE 2

| Electrode | Operation | | |
|---|---|---|---|
| | Program | Erase | Read |
| WL (Selected) | 2 V | 0 V | 4 V |
| Erase Gate (Selected) | 0 V | 14 V | 0 V |
| Source (Selected) | 12 V | 0 V | 0 V |
| Drain (Selected) | 0 V | 0 V | 2 V |
| WL (Not-Selected) | 0 V | 0 V | 0 V |
| Erase Gate (Not-Selected) | 0 V | 0 V | 0 V |
| Source (Not-Selected) | 0 V | 0 V | 0 V |
| Drain (Not-Selected) | 3 V | 0 V | 0 V |

As is shown by Table 2, in operating the one or more memory cells, there are four lines associated with each of the memory cells, the word line (WL), erase gate line (EL), source line (SL), and the bit line (BL or drain line). One or more selected memory cells can be operated by properly applying the necessary voltage potential to the respective lines.

As the geometry of transistor devices continues to decrease in size, in order to create minute openings in devices (for example, the openings illustrated in FIG. 5d between 78 and 87 or 76 and 87), conventional fabrication methods are no longer capable of creating these openings. A new method must be invented to overcome this problem. As part of the present invention, a method for creating minute openings (or sub-minimum feature) in devices is presented.

Figure 7A:
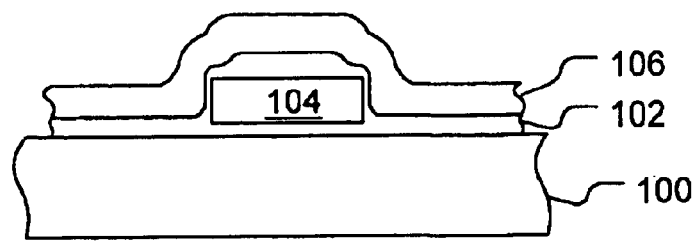
FIGS. 7a–7f illustrate cross-sectional views of a structure during various steps of a fabrication process in forming a minute opening.
Figure 7B:
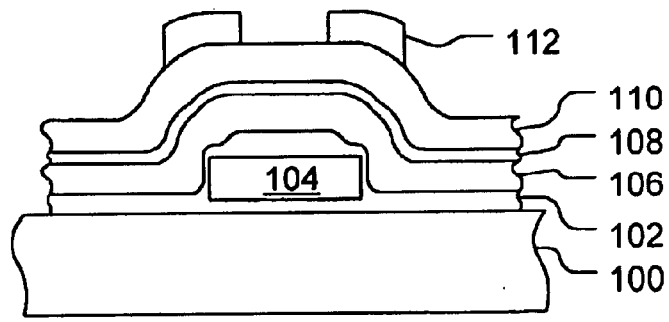
Figure 7C:
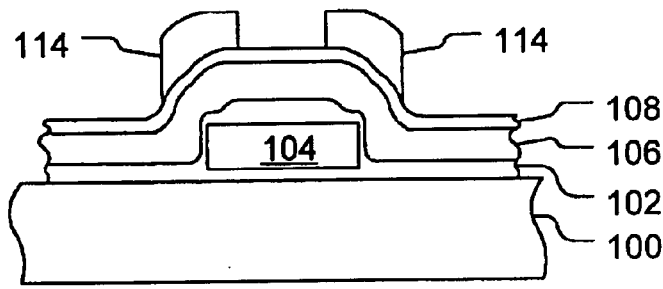
Figure 7D:
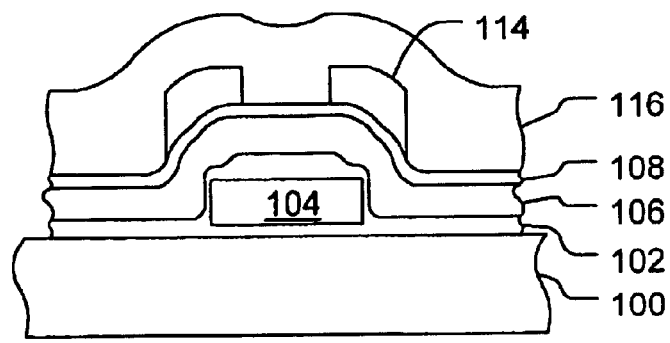
Figure 7E:
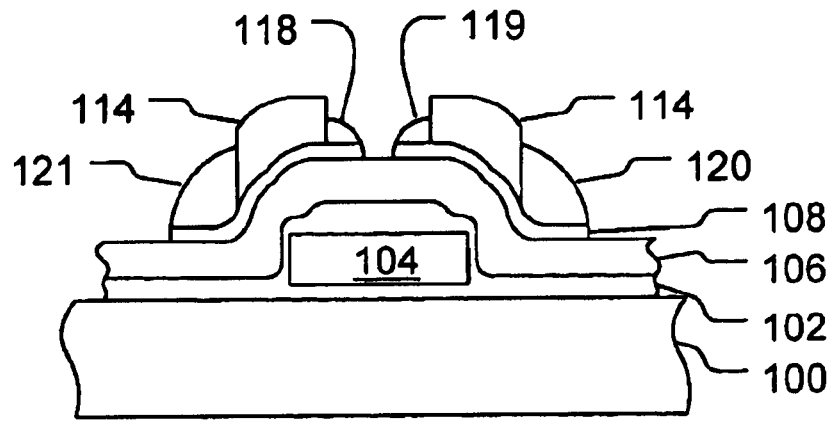
Figure 7F:
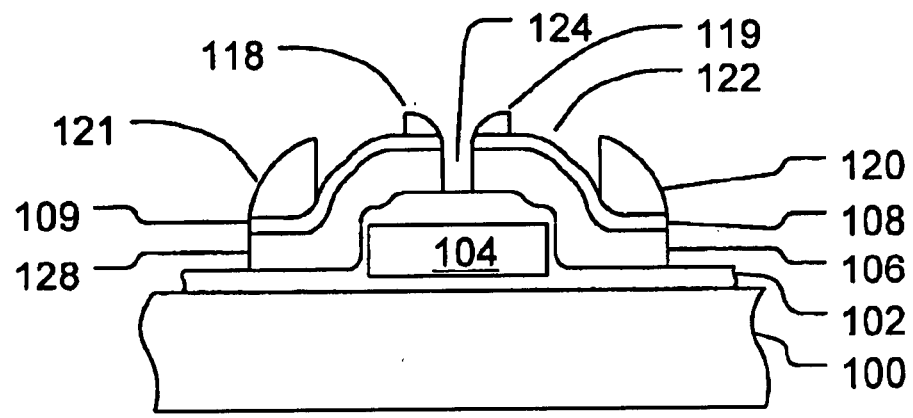

Referring to FIG. 7a, a structure having a substrate 100, a first insulating layer 102, a floating gate 104, and a second polysilicon layer 106 is illustrated. Note that the floating gate 104 is made from a first polysilicon layer. The second polysilicon layer 106 is laid over the floating gate 104 and the first insulating layer 102 over the substrate 100. Referring to FIG. 7b, a second insulation layer 108 is laid over the second polysilicon layer 106. Over the second insulation layer 108 is a third polysilicon layer 110 (also referred to as the sacrificial layer). A photo-resist mask 112 is provided over selected areas of the second polysilicon layer 110 in such a manner to create the desired opening. The thickness of the sacrificial polysilicon is chosen according to the desired dimension of the sub-minimum feature gap. In the next step, referring to FIG. 7c, the third polysilicon layer 110 is etched to create the block structures indicated at 114. With this structure, referring to FIG. 7d, an oxide layer 116 is deposited over the entire area. Referring to FIG. 7e, this oxide layer is etched to create spacers indicated at 118–121. These spacers serve as the mask for creating the sub-minimum feature gap on the second polysilicon layer 106. The spacers are created from a well controlled process because of the etch selectivity between the insulation layer and the polysilicon layer. The width of the ultimate gap or opening is determined by the width of the spacers and the gap in the sacrificial polysilicon layer. The width of the spacer is in turn determined by the thickness of the deposited third insulation layer and the thickness of the underlying sacrificial layer. Finally, in the next step, referring to FIG. 7f, exposed polysilicon areas are etched away to create the ultimate desired opening indicated at 124. More specifically, the sacrificial polysilicon layer is totally removed. The spacers are used as masks to allow a sub-minimum gap to be etched in the second polysilicon layer, taking advantage of the etch selectivity of polysilicon layer over the insulation layer which can be as high as 30 to 1 or 100 to 1. The second insulation layer first deposited on the second polysilicon layer also serves an etch stop for the polysilicon etch. The insulation layer can also be patterned to allow other patterns to be etched in the second polysilicon other than the small gap. In relating to the novel transistor of the present invention, the structure indicated at 126 can be used as the select gate and the structure indicated at 128 can be used as the erase gate.

Note that although the above described method refers to polysilicon layers, insulation layers, and a sacrificial layer, it is important to note that the material for the polysilicon layers and the sacrificial layer can be of any material (not limited to polysilicon) but they should have similar etching rates. Similarly, while the material for the insulation layer can be of any material, it should have dissimilar etching rate from that of the polysilicon layer and the sacrificial layer. Furthermore, as part of the disclosure and practice of the present invention in creating minute openings, it may be practiced on any two types of material with dissimilar etching rates. For example, referring to FIG. 7f, the layer for creating the structures indicated at 128 and 106 can be referred to as a first layer. The layer indicated at 108 and 109 can be referred to as a second layer. Referring to FIG. 7e, the layer for creating the structures indicated at 114 can be referred to as a third layer. Referring back to FIG. 7f, the layer for creating the spacers indicated at 118, 119, 120, and 121 can be referred to as the fourth layer. In accordance with the present invention, these four layers may be deposited and etched on any underlying structure in any form or shape.

Generally speaking, the first and third layers can be of any material and should have similar etching rate; the second and fourth layers can be of any material and should have similar etching rate. However, the material for the first and third layers versus the material for the second and fourth layers should have highly dissimilar etching rates. Materials for these layers include and are not limited to polysilicon, oxide, nitride, and metal.

Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

I claim:

1. A semiconductor device having at least one transistor, the device comprising:

a substrate having a channel region defined thereon;

a first insulating layer disposed over said channel region and over at last a portion of said substrate;

a floating gate having at least a substantial portion thereof disposed over said channel region and separated therefrom by said fist insulating layer, said floating gate having at least two side walls and a top surface;

a second insulating layer disposed over said side walls and over said top surface of said floating gate;

a control gate having a first portion disposed over a portion of said channel region and being separated therefrom by said second insulating layer, a second portion formed over a first one of said side walls and a third portion formed over at least a first portion of said top surface of said floating gate and being separated from said floating gate by said second insulating layer, said second portion having a surface substantially parallel to and opposing said first side wall;

an erase gate formed over a second one of said side walls and over at least a second portion of said top surface of said floating gate and being separated from said second one of said side walls and said portion of said top surface of said floating gate by said second insulating layer;

a drain region formed in a portion of said substrate proximate said first portion of the control gate; and a source region formed in a portion of said substrate proximate said erase gate, said source region having a substantial portion thereof underneath said floating gate;

wherein during an erase operation with the drain region, the source region and the control gate connected to ground, and a relatively high potential applied to the erase gate, stored electrons are removed from the floating gate to the erase gate through the Fowler-Nordheim tunneling process.

2. A semiconductor device having at least one transistor as recited in claim 1, wherein said erase gate overlaps said floating gate and at least a portion of said control gate.

3. A memory array disposed on a substrate comprising a plurality of memory cells each having a channel region formed in said substrate, a floating gate separated from said channel region by a first insulating layer, an erase gate, a control gate separated from said floating gate by a second insulating layer, a source region, and a drain region, comprising:

a plurality of rows and columns of interconnected memory cells wherein the control gates of memory cells in the same row are connected by a common word-line, the erase gates of the memory cells in the same row are connected by a common erase line, the source regions of the memory cells in the same rows are connected by a common source line, and the drain regions of memory cells in the same columns are commonly connected via a common drain line, wherein at least a portion of each said control gate is disposed over a portion of said channel region and is separated therefrom by said second insulating layer, said portion of the control gate being proximate to said drain region, and wherein a portion of said control gate is disposed in facing relationship to a side surface of said floating gate and is separated therefrom by said second insulating layer; and a control circuit connecting to said word-lines, erase lines, source lines and drain lines for operating one or more memory cells of said memory array; wherein said source region having a substantial portion thereof underneath said floating gate, and wherein during an erase operation with the drain region, the source region and the control gate connected to ground, and a relatively high potential applied to the erase gate, stored electrons are removed from the floating gate to the erase gate through the Fowler-Nordheim tunneling process.

4. A memory array disposed on a substrate as recited in claim 3 wherein said floating gate has a least a substantial portion thereof disposed over said channel region and is separated therefrom by said fist insulating layer, said control gate is substantially placed on one side of said floating gate and separated therefrom by said second insulation layer, said erase gate is substantially placed on a second side of said floating gate and is separated therefrom by said second insulation layer, said drain region is substantially disposed on said on side of said floating gate, and said source region is substantially disposed on said second side of said floating gate.

5. A memory array as recited in claim 4, wherein said erase gate overlaps said floating gate and at least a portion of said control gate.

* * * * *

UNITED STATES PATENT AND TRADEMARK OFFICE
CERTIFICATE OF CORRECTION

PATENT NO. : 6,876,031 B1  Page 1 of 1
APPLICATION NO. : 09/256265
DATED : April 5, 2005
INVENTOR(S) : Dah-Bin Kao et al.

It is certified that error appears in the above-identified patent and that said Letters Patent is hereby corrected as shown below:

On the cover page, item (73) Assignees should appear as follows:

(73) Assignees:  Winbond Electronics Corporation,
Hsin-Chu (TW)

Signed and Sealed this

Twenty-sixth Day of February, 2008

JON W. DUDAS
*Director of the United States Patent and Trademark Office*